US010192681B2

(12) United States Patent
Hugill et al.

(10) Patent No.: US 10,192,681 B2
(45) Date of Patent: Jan. 29, 2019

(54) METHOD OF MANUFACTURING A CRYOGENIC COIL ASSEMBLY

(71) Applicant: Gedex Systems Inc., Mississauga (CA)

(72) Inventors: Andrew Hugill, Toronto (CA); Ilia Tomski, Vaughan (CA); Glen B. Sincarsin, Richmond Hill (CA); Igor Terefenko, Mississauga (CA); Kieran A. Carroll, Brampton (CA); Wayne G. Sincarsin, Richmond Hill (CA)

(73) Assignee: Gedex Systems Inc., Mississauga (CA)

( * ) Notice: Subject to any disclaimer, the term of this patent is extended or adjusted under 35 U.S.C. 154(b) by 142 days.

(21) Appl. No.: 15/466,215

(22) Filed: Mar. 22, 2017

(65) Prior Publication Data

US 2017/0194095 A1 Jul. 6, 2017

Related U.S. Application Data

(62) Division of application No. 14/535,524, filed on Nov. 7, 2014, now Pat. No. 9,640,310.

(60) Provisional application No. 61/902,890, filed on Nov. 12, 2013.

(51) Int. Cl.

| | |
|---|---|
| ***H01L 39/24*** | (2006.01) |
| ***H01F 41/04*** | (2006.01) |
| ***H01F 6/06*** | (2006.01) |
| ***H01F 41/064*** | (2016.01) |
| ***H01F 41/098*** | (2016.01) |

(52) U.S. Cl.

CPC ............. *H01F 41/048* (2013.01); *H01F 6/06* (2013.01); *H01F 41/064* (2016.01); *H01F 41/098* (2016.01); *Y10T 29/49014* (2015.01)

(58) Field of Classification Search

CPC .... H01F 41/048; H01F 41/098; H01F 41/064; H01F 6/06; Y10T 29/49014; Y10T 29/49071

USPC .......................................... 29/599, 605, 606

See application file for complete search history.

(56) References Cited

U.S. PATENT DOCUMENTS

| | | | | |
|---|---|---|---|---|
| 3,412,354 A * | 11/1968 | Sattler ...................... | H01B 3/30 29/605 |
| 4,101,731 A | 7/1978 | Marancik | |
| 4,384,265 A | 5/1983 | Shimamoto et al. | |

(Continued)

FOREIGN PATENT DOCUMENTS

| | | |
|---|---|---|
| CN | 101075495 A | 11/2007 |
| EP | 0507283 A1 | 10/1992 |
| JP | 5850711 A | 3/1983 |

OTHER PUBLICATIONS

Patent Corporation Treaty, Notification of Transmittal of the International Search Report and the Written Opinion of the International Searching Authority, or the Declaration, dated Jan. 27, 2015.

(Continued)

*Primary Examiner* — Donghai D Nguyen

(74) *Attorney, Agent, or Firm* — Bereskin & Parr LLP/S.E.N.C.R.L., s.r.l.

(57) ABSTRACT

A cryogenic coil assembly including a coil substrate with a flat surface, and a number of radial channels cut into a region of the flat surface. The cryogenic coil assembly also includes a spiral coil covering the radial channels, and a chemical bonding agent for bonding the spiral coil to the coil substrate. The chemical bonding agent is present within the radial channels.

19 Claims, 9 Drawing Sheets

(56) References Cited

U.S. PATENT DOCUMENTS

| | | | | |
|---|---|---|---|---|
| 4,841,772 | A | 6/1989 | Paik | |
| 5,173,678 | A * | 12/1992 | Bellows | H01F 6/06<br>29/606 |
| 5,318,948 | A | 6/1994 | Okada et al. | |
| 6,601,289 | B1 | 8/2003 | Kobayashi | |
| 6,799,363 | B1 * | 10/2004 | Dickinson | H02K 31/02<br>29/599 |
| 2006/0071747 | A1 | 4/2006 | Friedman et al. | |
| 2009/0251271 | A1 | 10/2009 | Stelzer et al. | |

OTHER PUBLICATIONS

Technological Development of Yttrium-based Superconducting Power Equipment, Superconductivity Web21, Aug. 15, 2013, International Superconductivity Technology Center, Kanagawa, Japan.

* cited by examiner

METHOD OF MANUFACTURING A CRYOGENIC COIL ASSEMBLY

CROSS-REFERENCE TO RELATED APPLICATIONS

This application is a divisional of U.S. patent application Ser. No. 14/535,524, filed Nov. 7, 2014, which claims the benefit of U.S. Provisional Patent Application No. 61/902,890, filed Nov. 12, 2013. The entire contents of U.S. patent application Ser. No. 14/535,524 and U.S. Provisional Patent Application No. 61/902,890 are incorporated by reference herein.

FIELD

The disclosed embodiments relate to the field of cryogenic electrical coils.

More specifically, the disclosed embodiments relate to a flat spiral coil for use at cryogenic temperatures that does not delaminate from its substrate.

BACKGROUND

A flat spiral coil, or pancake coil, is a common electrical device often used for sensing, modulating or creating electric and magnetic fields. Generally, when assembling a flat spiral coil, wire is drawn through an epoxy resin bath, so that the resin coats the outside of the wire, before the wire is wound into the flat spiral shape on a substrate. As the epoxy resin cures it creates a bond with the substrate which holds the flat spiral coil in position and keeps its shape. This technique works well for coils created and used at or near room temperature.

For many applications, however, colder temperatures are required. For example, superconductivity requires cryogenic temperatures. In many cases, winding a flat spiral coil from superconducting wire can be useful, allowing, for example, much more sensitive instruments to be built than is possible with non-superconducting wire. In such highly sensitive applications, geometric stability is a concern and large changes in temperature caused by cooling a coil to superconducting temperatures results in thermal contraction of the wires, substrate and epoxy resin creating stresses, and straining or warping of materials. In addition, when using an epoxy resin to bond a superconducting coil to a substrate and subsequently cooling it to cryogenic temperatures, differential thermal contraction frequently causes shear forces greater than the epoxy-substrate bond can sustain, resulting in delamination of the coil.

One approach to solving this problem is to attempt to match the coefficients of thermal expansion of the wire, substrate and epoxy. However, while it is sometimes possible to match two of these closely, matching all three is often very difficult. Even if it can be achieved, it often requires undesirable trade-offs in other material properties, such as thermal conductivity or workability of materials.

SUMMARY

According to one embodiment of the invention, a cryogenic coil assembly is disclosed. The cryogenic coil assembly comprises:

a substrate having a flat surface;

a plurality of radial channels defined in a region of the flat surface;

a spiral coil covering the plurality of radial channels; and a chemical bonding agent for bonding the spiral coil to the substrate, wherein the chemical bonding agent is present within the plurality of radial channels.

According to another embodiment of the invention, a method of manufacturing a cryogenic coil assembly is disclosed. The method comprises:

a) securing a wire lead of a wire within a lead channel of a substrate, wherein a plurality of radial channels and the lead channel are formed in a substantially circular region of the substrate, b) clamping the substrate to a backing plate, wherein a gap is defined between the substrate and the backing plate to accommodate the wire, wherein the backing plate is adapted to resist adherence to a chemical bonding agent;

c) removably securing a mandrel to the backing plate and substrate, wherein the mandrel locates in a hole defined in a center of the circular region of the substrate;

d) turning the mandrel, substrate, and backing plate to wind the wire into a spiral coil, wherein the wire passes through a bath before being wound into the coil, wherein the bath contains the chemical bonding agent; and e) permitting the chemical agent to cure, wherein during curing, the chemical agent seeps into the radial channels.

BRIEF DESCRIPTION OF THE DRAWINGS

For a better understanding of the described example embodiments and to show more clearly how they may be carried into effect, reference will now be made, by way of example, to the accompanying drawings in which.

DETAILED DESCRIPTION OF VARIOUS EMBODIMENTS

Figure 1:
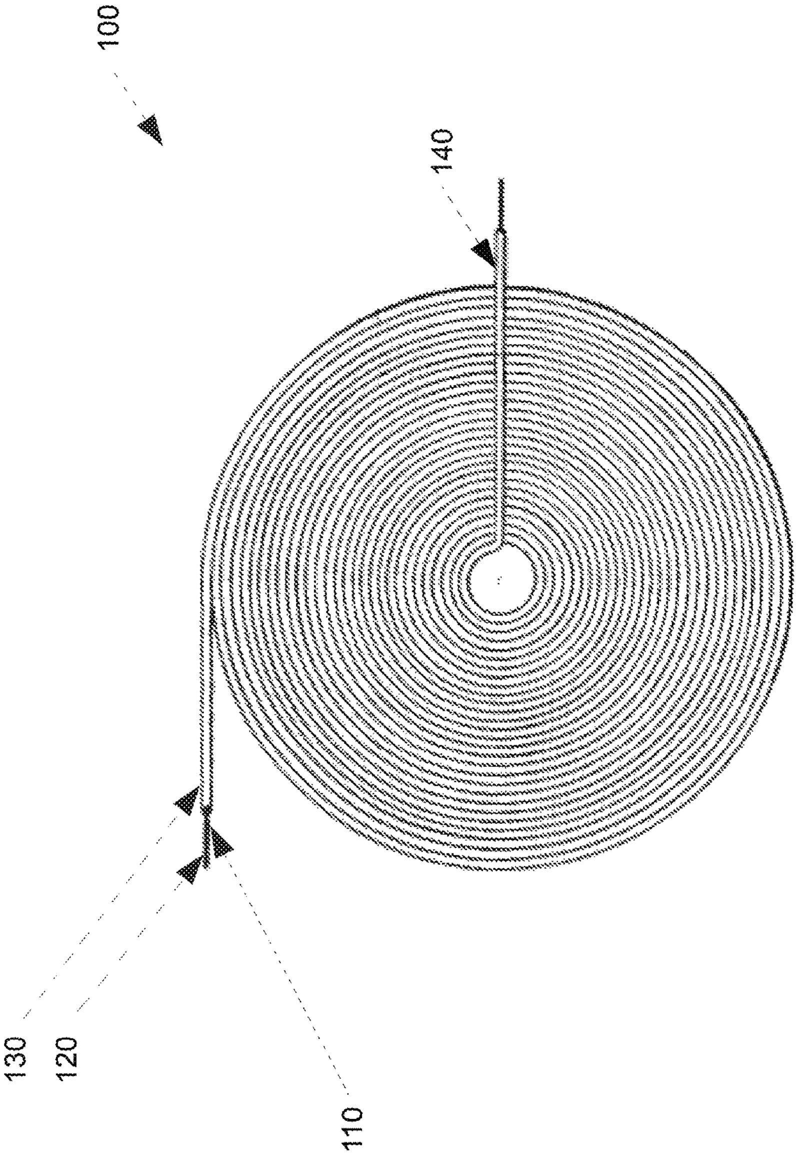
FIG. 1 shows an example of a spiral coil.

According to an exemplary embodiment, FIG. 1 shows a flat spiral coil 100. Preferably, the coil is a wire spiral one layer thick, except where the wire lead 140 crosses over the windings to reach the center of the coil. As shown, the wire 110 has a conductive core 120 surrounded by insulation 130. The description below will refer to a simple flat spiral coil similar to the one shown in FIG. 1. However, those skilled in the art will understand that the described embodiments are applicable to any type of wire coil that is bonded to a substrate. For example, the coil may be a bifilar flat spiral coil. Alternatively, the circular geometry described herein can be modified for other closely packed wire shapes to be bonded to a substrate at room temperature but operated at a cryogenic temperature.

Figure 2B:
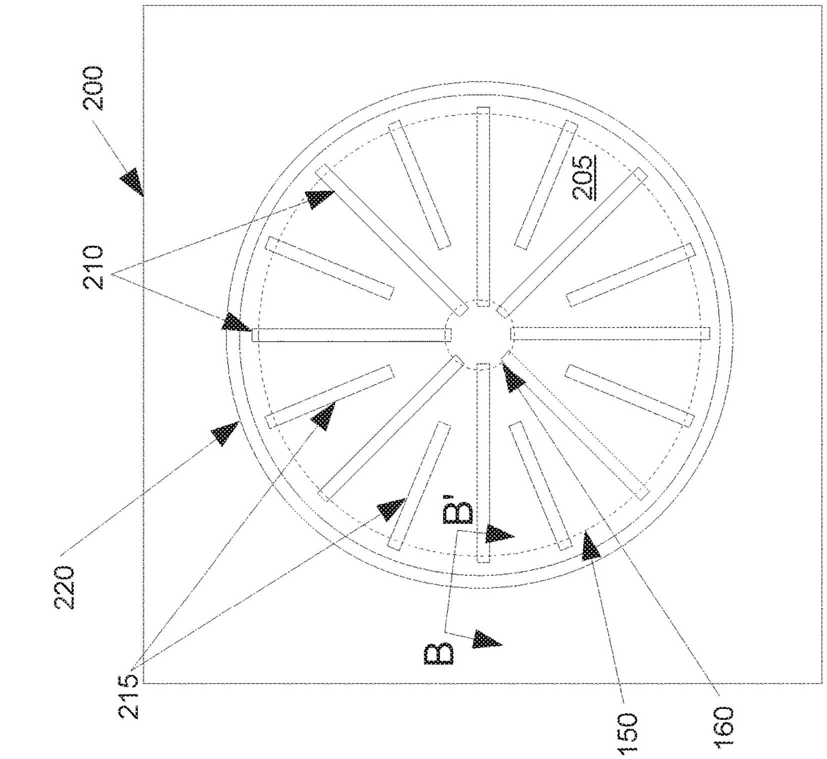
FIG. 2B shows a plan view of another embodiment of a shaped substrate.
Figure 2A:
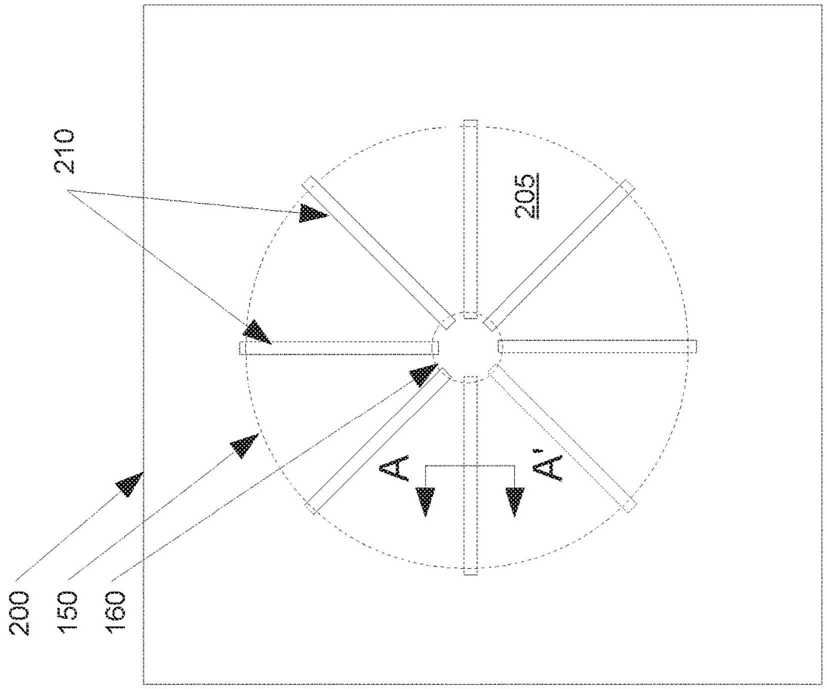
FIG. 2A shows a plan view of one embodiment of a shaped substrate.

FIG. 2A shows a plan view of one embodiment of a shaped substrate 200. Dashed lines 150, 160 show approximately the location of the outer edge 150 and inner edge 160 of flat spiral coil 100 after winding. Surface 205 of substrate 200 where flat spiral coil 100 sits is machined flat except for a series of radial channels 210. Radial channels 210 are cut into the flat surface 205 of substrate 200 and, preferably, extend from slightly inside the inner edge 160 to slightly outside the outer edge 150 of flat spiral coil 100 so that there is no complete turn of flat spiral coil 100 that does not pass over at least one radial channel 210. A distance of 1-3 wire diameters has been found to be sufficient. For example, consider a coil comprising 150 μm diameter wire with an inner diameter of 4.5 mm and an outer diameter of 22 mm. In this case, a distance of 150-450 μm from the end of radial channels 210 should be sufficient.

FIG. 2A shows eight radial channels 210 spaced evenly around a circle. However, any suitable number of radial channels may be used depending on the desired spacing between radial channels 210.

FIG. 2B shows a plan view of another embodiment of shaped substrate 200. Parts in this figure that correspond to those in FIG. 2A are assigned like reference numbers. In this embodiment, supplemental radial channels 215, beginning a predetermined distance from the inner edge 160 and extending just past the outer edge 150, are also cut into surface 205. The space between radial channels 210 increases radially from the inner edge 160 to outer edge 150. Accordingly, the distance that wire 110 must extend across surface 205 without passing over a radial channel also increases radially outwards. At cryogenic temperatures, portions of flat spiral coil 100 between radial channels 210 can delaminate if the epoxy resin loses its hold on surface 205. When this happens, those portions of flat spiral coil 100 can bow upwards, away from surface 205, warping the coil and potentially contacting any material near surface 205, such as an object being measured. Depending on the application and the size of flat spiral coil 100, there may be a maximum separation distance between radial channels 210 that can be tolerated before delamination of the portions of flat spiral coil 100 between radial channels 210 exceeds a predetermined maximum. Supplemental radial channels 215 can be added to substrate 200 in order to keep the length of wire 110 between any two adjacent radial channels 210 or supplemental radial channels 215 within such maximum separation distance tolerances. For example, consider a coil comprising 150 μm diameter wire. It has been found that a maximum separation distance between any two radial channels 210 of about 3.5 mm is sufficient to minimize delamination. In this case, supplemental radial channels 215 would begin where the separation between radial channels 210 is 3.5 mm and proceed radially outwards from there. For a circular coil, $$r = \frac{xn}{2\pi},$$

where r is the distance from the center of the circular coil (not inner edge 160) where supplemental radial channels 215 begin, x is the desired maximum separation between radial channels 210 and n is the number of radial channels. Accordingly, for a 3.5 mm desired separation with 8 radial channels, supplemental radial channels should begin approximately 4.4 mm from the center of the coil.

FIG. 2B also shows optional circumferential channel 220. Circumferential channel 220 is preferably of a diameter slightly greater than flat spiral coil 100 so that no turns of wire 110 will accidentally slip into circumferential channel 220 during winding. Although, not shown, radial channels 210 or supplemental radial channels 215 may intersect circumferential channel 220.

Once substrate 200 is prepared, wire 110 will be pulled through an epoxy resin bath before being wound into flat spiral coil 100 on surface 205 of substrate 200.

Epoxy resin will surround wire 110 and seep into radial and circumferential channels 210, 215, 220. As the epoxy resin cures, it will create a bond with the surface 205, thereby holding wire 110 in the shape of flat spiral coil 100.

Figures 3A, 3B, 3C, 3D:
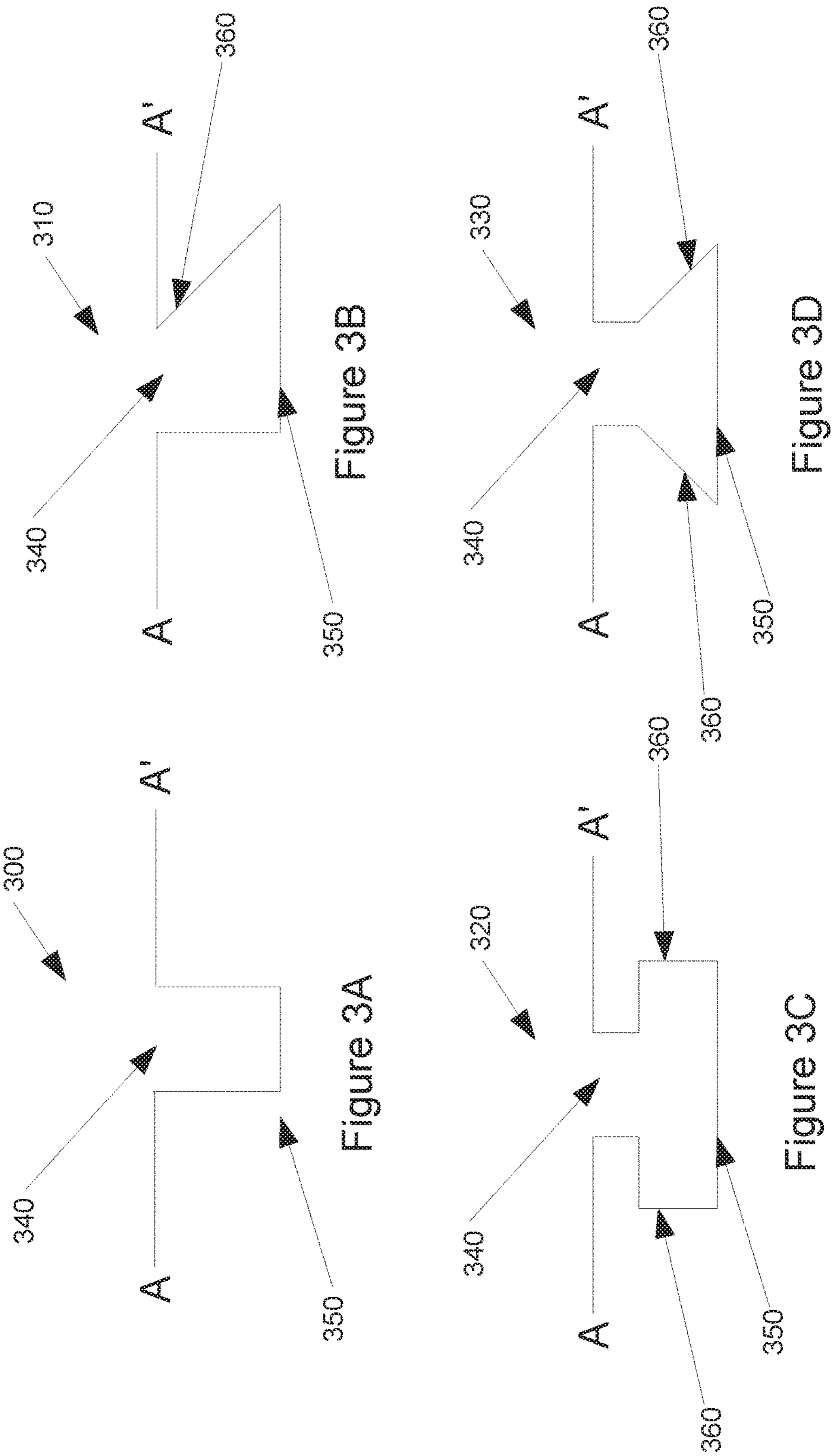
FIGS. 3A-3D show example embodiments of a cross section along line A-A'.

FIGS. 3A-3D show example embodiments of a cross section, respectively 300, 310, 320, 330 of radial channels 210 along line A-A' in FIG. 2A. FIG. 3A shows a rectangular cross section. FIGS. 3B-3D show undercut cross sections, where the mouth 340 of radial channel 210 is narrower than the base 350 creating at least one undercut 360. Preferably, radial channel 210 is cut according to the cross sectional shape shown in FIG. 3D. Undercut cross sections are preferred over rectangular cross sections. Cross section 330 is particularly preferred for ease of machinability and the thickness of the flanges above undercuts 360. It will be appreciated that other variations of the cross-sectional shape of channels 210 may also be used. In such shapes, it is preferred that the mouth of the channel is narrower than some portion of the channel below the mouth that is accessible to the epoxy resin. Generally, the choice of width and depth of radial channels 210 should be guided by the choice of epoxy resin and the diameter of wire 110. In one example embodiment, with a wire diameter of 150 μm and TRA-BOND 2115 epoxy resin, channels approximately 250 μm wide at mouth 340 and 250 μm deep were found to be effective.

Figure 4A:
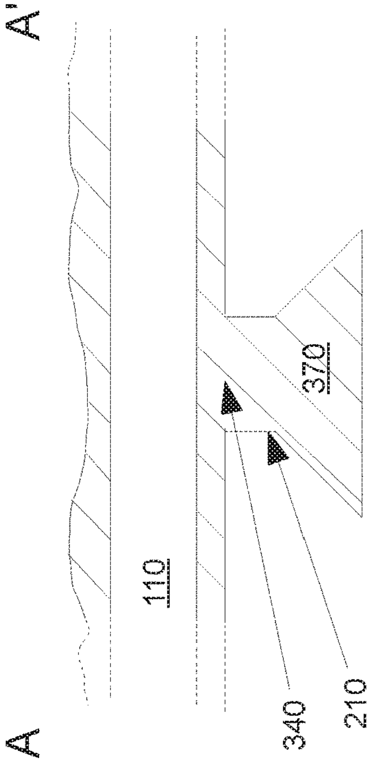
FIG. 4A shows a cross section along line A-A' with a flat spiral coil and cured epoxy in place.

Radial channels 210 cut according to the cross section shown in one of FIGS. 3A-3D operate in at least two ways to increase adhesion of flat spiral coil 100 to surface 205 and prevent delamination. First, an increased surface area means a larger area over which the epoxy resin can bond to substrate 200. Second, as shown in FIG. 4A using cross section 330, cured epoxy plug 370 will not fit through mouth 340 of radial channel 210, thereby providing a mechanical bond between the wire 110 of flat spiral coil 100 and substrate 200. This mechanical bond resists delamination, even if differential thermal contraction has caused the epoxy-substrate chemical bond to shear.

Figure 4B:
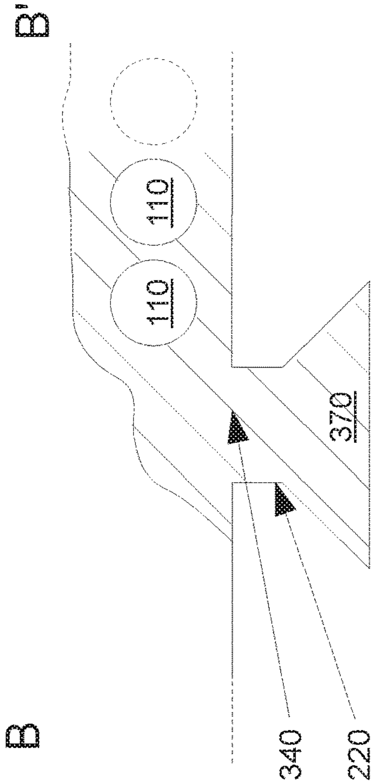
FIG. 4B shows a cross section along line B-B' with a flat spiral coil and cured epoxy in place.

If supplemental radial channels 215 are used then they will also preferably be cut according to cross section 330, as shown in FIG. 4A, so that cured epoxy plug 370 will provide mechanical resistance to delamination. Likewise, if circumferential channel 220 is used, it will preferably be cut according to cross section 330, as shown in FIG. 4B, so that cured epoxy plug 370 will provide mechanical resistance to delamination.

Figure 5:
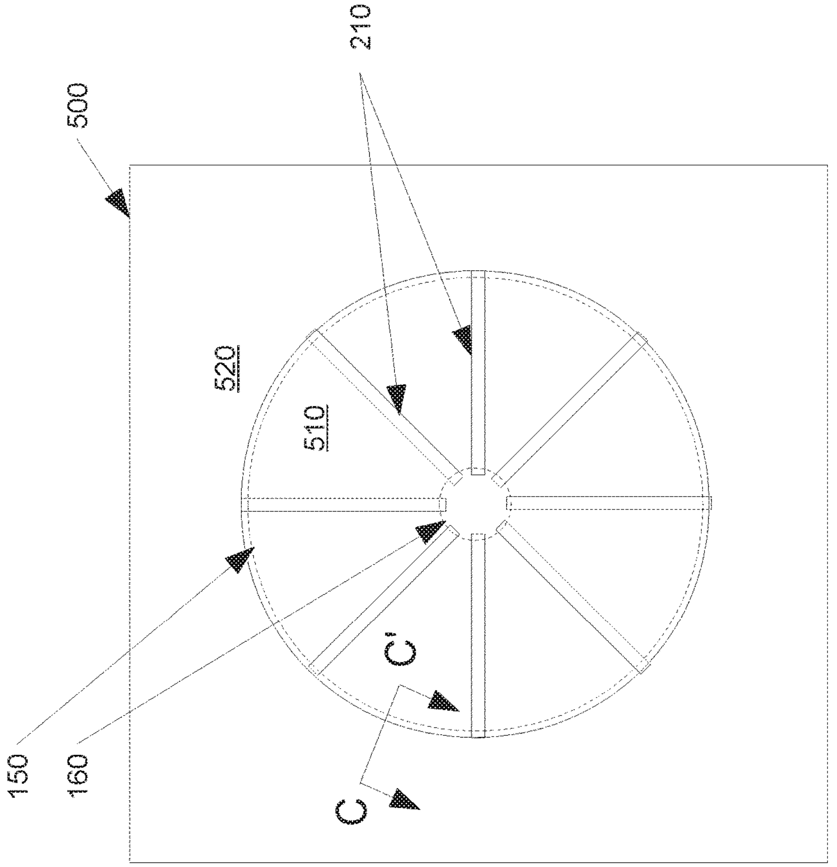
FIG. 5 shows a plan view of another embodiment of a shaped substrate.
Figure 6B:
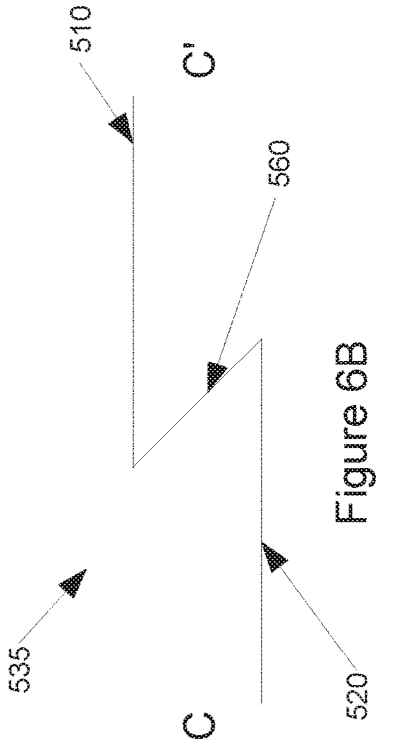
FIGS. 6A-6D show example embodiments of a cross section along line C-C'
Figure 6D:
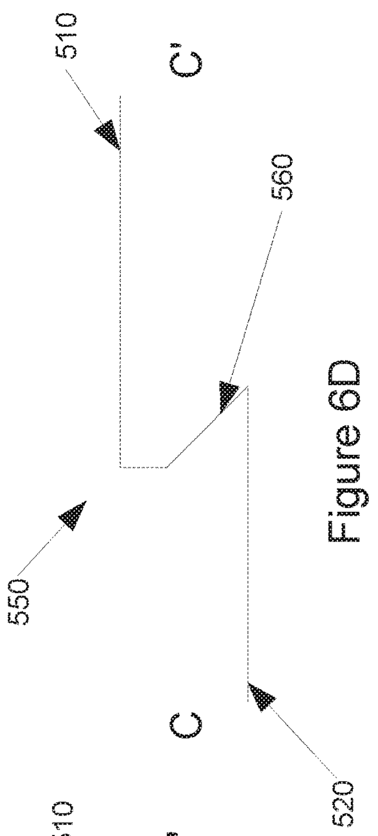
Figure 6A:
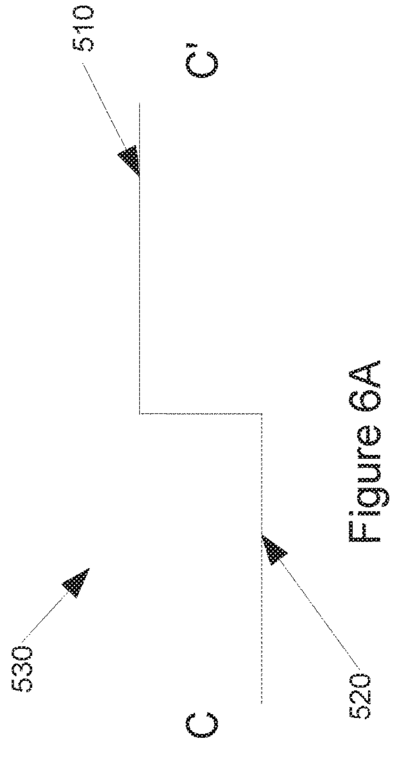
Figure 6C:
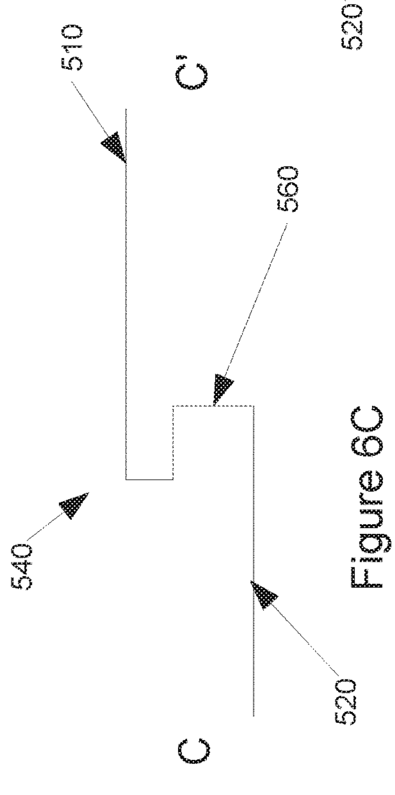

FIG. 5 shows, a plan view of another embodiment of shaped substrate 500. Dashed lines show approximately where the outer edge 150 and inner edge 160 of flat spiral coil 100 will sit after winding. This embodiment is obtained from the embodiment shown in FIG. 2B by machining away the surface outside of circumferential channel 220 (shown in FIG. 2B) down to, for example, the level of the bottom surface 350 (shown in FIG. 3D) of circumferential channel 220. The result is a pedestal shape with an upper flat surface 510 into which radial channels 210 are cut, and a lower flat surface 520 surrounding the upper flat surface 510. Radial channels 210 are preferably identical to those described above and flat spiral coil 100 rests entirely on upper flat surface 510.

Supplemental radial channels 215 (not shown in FIG. 5) preferably identical to those described above may also be used.

The transition from lower flat surface 520 to upper flat surface 510, along line C-C' in FIG. 5, can have several shapes. Exemplary transition shapes 530, 535, 540 and 550 are shown in FIGS. 6A-6D, respectively. Transitions 535, 540 and 550 have undercuts 560. Cross sections with undercuts are preferred, while cross section 550 is particularly preferred for ease of machinability and the thickness of the flange above undercut 560. Generally, the vertical distance between lower flat surface 520 and upper flat surface 510 will be similar to the depth of radial channels 210 and should be guided by the choice of epoxy resin and the diameter of wire 110. In one example embodiment, using wire of 150 μm diameter and TRA-BOND 2115 epoxy resin, a vertical separation of approximately 250 μm was found to be effective.

Figure 7:
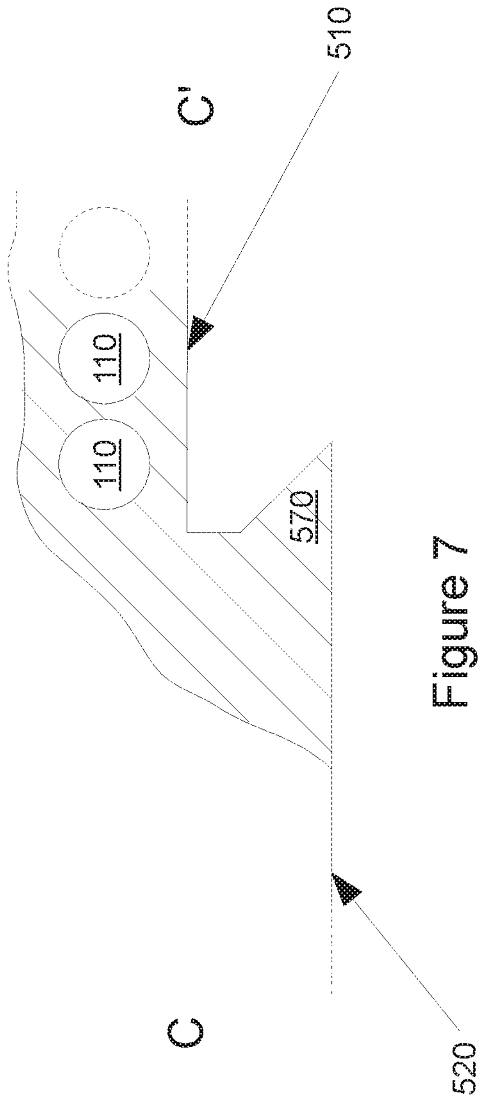
FIG. 7 shows a cross section along line C-C' with a flat spiral coil and cured epoxy in place.

FIG. 7 shows a cross-sectional view along line C-C' with wire 110 of flat spiral coil 100 in place. Cured epoxy plug 570 provides a mechanical anchor or hook to help prevent delamination of flat spiral coil 100. In addition, the epoxy resin contracts more than substrate 500 as it is cooled and the hoop stress created along the wall of the pedestal by the differential thermal contraction may also resist delamination.

Figure 8:
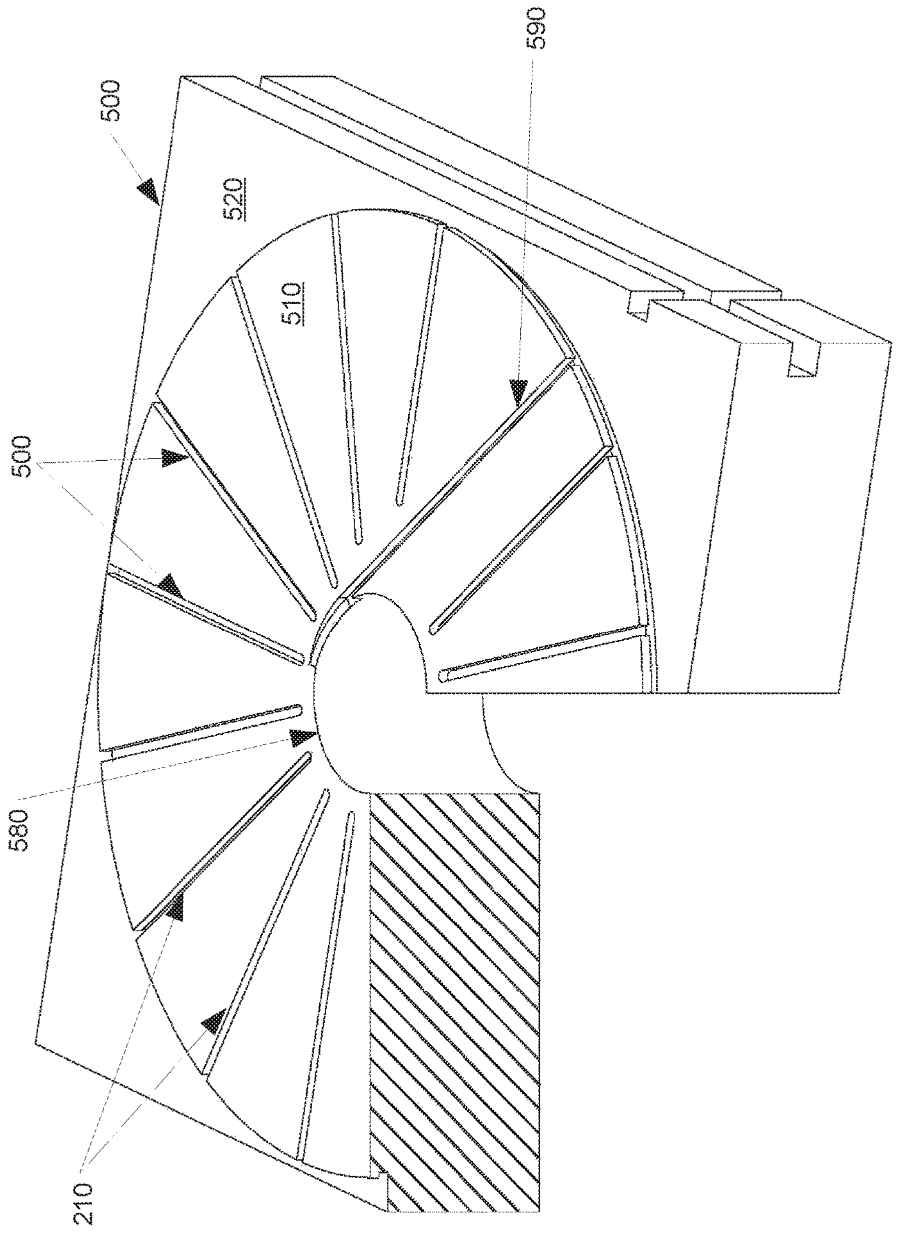
FIG. 8 shows a perspective cut-away view of another embodiment of a shaped substrate.

FIG. 8 shows a perspective cut-away view of another embodiment of shaped substrate 500. In addition to features discussed above, this embodiment illustrates two additional optional features: central hole 580 and lead channel 590.

Central hole 580 passes through substrate 500 where the center of flat spiral coil 100 is to be located. Central hole 580 may be used for insertion of a mandrel (not shown in FIG. 8) around which flat spiral coil 100 is to be wound. Once winding is complete the mandrel can be removed.

Lead channel 590 runs from the outer edge of upper flat surface 510 to central hole 580. Lead channel 590 allows wire lead 140 to run under flat spiral coil 100 so as to keep the outward facing surface of flat spiral coil 100 as flat as possible. This is particularly useful when flat spiral coil 100 is to be used in very close proximity to another object, such as an object being measured. Some applications require flat spiral coil 100 to be within a wire diameter of an object to be measured and running wire lead 140 under flat spiral coil 100 enables these applications. Preferably, lead channel 590 intersects central hole 580 at a tangent, as shown in FIG. 8. Other radial channels 210 or supplemental radial channels 215 may be adjusted to accommodate lead channel 590.

The substrate designs described above provide a significant degree of flexibility in material choice when constructing a flat spiral coil for use at cryogenic temperatures. For example, a typical application of a cryogenic coil assembly is a superconducting coil used for measurement of small changes in electric or magnetic fields. It is often preferable to use a metal for the wires due to ease of winding the coil and it can be a requirement that the substrate be constructed of a metal, ceramic or other highly dimensionally stable material. For precision applications, a low coefficient of thermal expansion in the wires and substrate, often significantly lower than is possible for epoxy resin, is highly desirable so that the dimensions of the coil will not change significantly as it is cooled. Further, a close match of coefficients of thermal expansion between wire and the substrate may be necessary to minimize warping of the shape of the coil as it is cooled.

The use of cured epoxy plugs in channels has been found to provide a mechanical bond that resists delamination in addition to the chemical bond formed by the epoxy and the surface of the substrate. The additional mechanical strength allows relaxation of the constraints on matching the coefficient of thermal expansion of the epoxy resin to those of the wires and substrate. Differences in thermal expansion between the epoxy resin and the wire/substrate of a factor of 10 or more have been tested and show no significant delamination of the coil.

For example, one suitable combination of materials includes Niobium wires with a Macor™ substrate and TRA-BOND 2115 epoxy resin. Niobium and Macor™ have very similar thermal properties. Niobium exhibits superconductive properties at cryogenic temperatures. Macor™ is a machinable ceramic suitable for carving channels with undercuts in the manner described above. TRA-BOND 2115 epoxy resin performs adequately at cryogenic temperatures, wets the wire well during winding and bonds well to Macor™.

Figure 9:
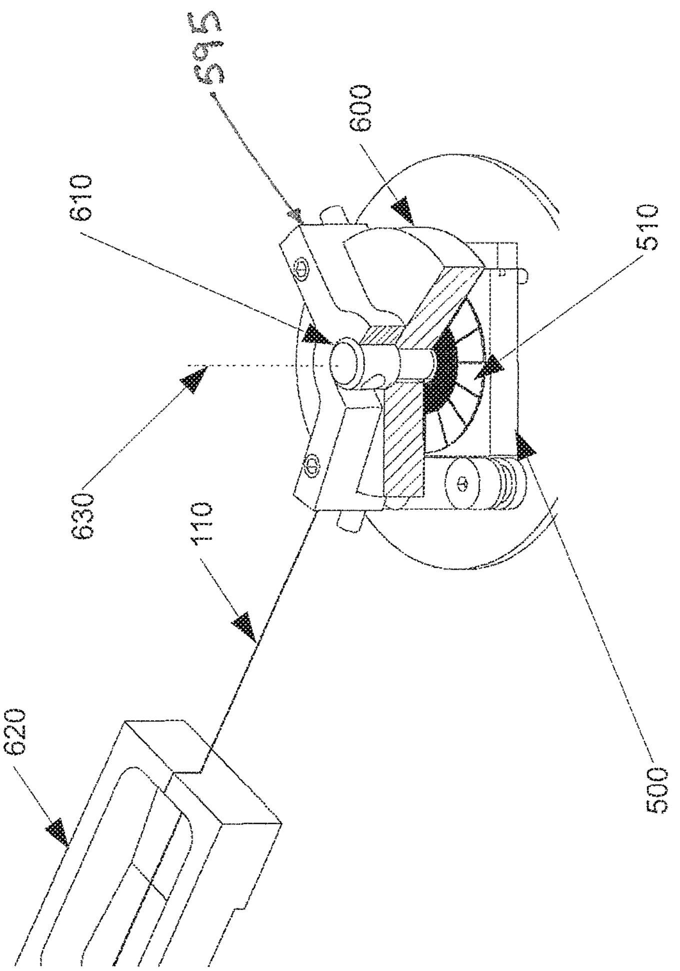
FIG. 9 shows a perspective cut-away view of one method of manufacturing a cryogenic coil assembly.

FIG. 9 shows a perspective cut-away view of an exemplary cryogenic coil assembly being manufactured according to an exemplary method. A shaped substrate 500, preferably machined according to FIG. 8 as discussed above with a wire lead 140 in lead channel 590, is clamped by a clamp 595 to a backing plate 600 with a mandrel 610 extending through central hole 580 (shown in FIG. 8). A gap slightly greater than the diameter of wire 110 is preferably maintained between upper flat surface 510 and backing plate 600. Preferably, backing plate 600 is covered with a material to which the epoxy will not adhere. For example, Teflon™ has been found to be an effective covering. Mandrel 610, backing plate 600 and substrate 500 are turned about central axis 630 in order to draw wire 110 into a spiral shape around mandrel 610 on upper flat surface 510. Wire 110 passes through epoxy bath 620 immediately before winding. Referring now to FIGS. 4B, 8, 9, and 6D, wire 110 is wound into flat spiral coil 100 before the epoxy cures, giving the epoxy time to seep into undercuts 360 in radial channels 210 and supplemental radial channels 215 as well as undercut 550 in transition 540 at the edge of upper flat surface 510. Once the epoxy cures, cured epoxy plugs 370, 570 are formed conferring mechanical resistance to delamination, even when the assembly is cooled to cryogenic temperatures.

The scope of the claims should not be limited by the embodiments and examples described herein, but should be given the broadest interpretation consistent with the description as a whole.

The invention claimed is:

1. A method of manufacturing a cryogenic coil assembly, the method comprising:

a) securing a wire lead of a wire within a lead channel of a substrate, wherein a plurality of radial channels and the lead channel are formed in a substantially circular region of the substrate, b) clamping the substrate to a backing plate, wherein a gap is defined between the substrate and the backing plate to accommodate the wire, wherein the backing plate is adapted to resist adherence to a chemical bonding agent;

c) removably securing a mandrel to the backing plate and substrate, wherein the mandrel locates in a hole defined in a center of the circular region of the substrate;

d) turning the mandrel, substrate, and backing plate to wind the wire into a spiral coil, wherein the wire passes through a bath before being wound into the coil, wherein the bath contains the chemical bonding agent; and e) permitting the chemical agent to cure;

wherein the chemical agent seeps into the radial channels prior to being cured, such that the chemical bonding agent, when cured, is present within the radial channels.

2. The method of claim 1, wherein each of the radial channels comprises at least one undercut portion and the chemical bonding agent, when cured, is present within the at least one undercut portion of the radial channel.

3. The method of claim 2, wherein the chemical bonding agent located in the undercut portion of the radial channel forms a mechanical plug, wherein the mechanical plug is adapted to resist separation of the coil from the substrate.

4. The method of claim 1, wherein the wire is wound into the spiral coil such that at least one of the radial channels extends outwardly beyond an outer edge of the spiral coil and inwardly beyond an inner edge of the spiral coil.

5. The method of claim 4, wherein:

a) a plurality of supplemental radial channels are formed in the region of the substrate; and b) the wire is wound into the spiral coil such that at least one of the supplemental radial channels extends outwardly beyond the outer edge of the spiral coil and an inner end of the at least one supplemental radial channel is located at a predetermined distance outward from the inner edge of the spiral coil.

6. The method of claim 5, wherein the wire is wound into the spiral coil such that a distance (r) of the inner end of the at least one supplemental radial channel from the center of the coil is defined according to the formula:

$$r = \frac{xn}{2\pi}$$

where x is a desired maximum separation between radial channels and n is the number of radial channels.

7. The method of claim 5, wherein each of the supplemental radial channels comprises at least one undercut portion and the chemical bonding agent, when cured, is present within the at least one undercut portion of the supplemental radial channel.

8. The method of claim 7, wherein the chemical bonding agent located in the undercut portion of the supplemental radial channel forms a mechanical plug, wherein the mechanical plug is adapted to resist separation of the coil from the substrate.

9. The method of claim 1, wherein a circumferential channel is formed in the substrate around a circumferential edge of the circular region.

10. The method of claim 9, wherein the circumferential channel comprises at least one undercut portion and the chemical bonding agent, when cured, is present within the at least one undercut portion of the circumferential channel.

11. The method of claim 10, wherein the chemical bonding agent located in the undercut portion of the circumferential channel forms a mechanical plug, wherein the mechanical plug is adapted to resist separation of the coil from the substrate.

12. The method of claim 1, wherein the circular region comprises a substantially circular pedestal and the substrate is formed with an area surrounding the pedestal that is below the pedestal.

13. The method of claim 12, wherein a circumferential outer edge of the pedestal comprises at least one undercut portion, and the chemical bonding agent, when cured, is present within the undercut portion of the circumferential edge.

14. The method of claim 13, wherein the chemical bonding agent located in the undercut portion of the circumferential outer portion of the pedestal forms a mechanical plug, wherein the mechanical plug is adapted to resist separation of the coil from the substrate.

15. The method of claim 12, wherein the lead channel extends tangentially from an edge of the hole defined in the center of the circular region to a circumferential outer edge of the pedestal.

16. The method of claim 1, wherein the chemical bonding agent is an epoxy.

17. A method of manufacturing a cryogenic coil assembly, the method comprising:

a) securing a wire lead of a wire within a lead channel of a substrate having a flat surface, wherein a plurality of radial channels and the lead channel are formed in a substantially circular region of the flat surface;

b) passing the wire through a bath that contains a chemical bonding agent;

c) winding the wire into a spiral coil on the flat surface covering the plurality of radial channels;

wherein the wire passes through the bath before being wound into the coil and the chemical bonding agent seeps into the radial channels such that the chemical bonding agent, when cured, is present within the radial channels.

18. The method of claim 17, wherein each of the radial channels comprises at least one undercut portion and the chemical bonding agent, when cured, is present within the at least one undercut portion of the radial channel.

19. The method of claim 18, wherein the chemical bonding agent located in the undercut portion of the radial channel forms a mechanical plug, wherein the mechanical plug is adapted to resist separation of the coil from the substrate.

* * * * *